United States Patent
Wada

(10) Patent No.: US 9,902,404 B2
(45) Date of Patent: Feb. 27, 2018

(54) ARTICLE TRANSPORT FACILITY

(71) Applicant: Daifuku Co., Ltd., Osaka-shi (JP)

(72) Inventor: Yoshinari Wada, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 35 days.

(21) Appl. No.: 15/204,240

(22) Filed: Jul. 7, 2016

(65) Prior Publication Data

US 2017/0008700 A1    Jan. 12, 2017

(30) Foreign Application Priority Data

Jul. 10, 2015   (JP) .................................. 2015-139099

(51) Int. Cl.
| | | |
|---|---|---|
| *G06F 7/00* | (2006.01) | |
| *B65H 1/00* | (2006.01) | |
| *B61B 3/02* | (2006.01) | |
| *H01L 21/677* | (2006.01) | |

(52) U.S. Cl.
CPC ............ *B61B 3/02* (2013.01); *H01L 21/6773* (2013.01); *H01L 21/67727* (2013.01); *H01L 21/67733* (2013.01); *B65G 2201/0297* (2013.01)

(58) Field of Classification Search
None
See application file for complete search history.

(56) References Cited

U.S. PATENT DOCUMENTS

| | | | |
|---|---|---|---|
| 6,095,054 A * | 8/2000 | Kawano | .................. B61B 13/04 104/130.07 |
| 8,915,690 B2 | 12/2014 | Ota | |
| 2004/0234362 A1* | 11/2004 | Iijima | .............. G05B 19/41865 414/222.1 |
| 2016/0152540 A1* | 6/2016 | Ulrich | ....................... C07C 7/20 426/546 |

* cited by examiner

*Primary Examiner* — Yolanda Cumbess
(74) *Attorney, Agent, or Firm* — The Webb Law Firm

(57) ABSTRACT

When transporting an article between a transport target location that belongs to, located along, or associated with, a first travel path in which actuating electricity is supplied to transport vehicles and a transport target location that belongs to, located along, or associated with, a second travel path in which actuating electricity is not supplied to transport vehicles, a managing member manages traveling of a first transport vehicle to cause the first transport vehicle to travel only along a first travel path and manages traveling of a second transport vehicle to cause the second transport vehicle to travel along both a first travel path and a second travel path.

11 Claims, 5 Drawing Sheets

ARTICLE TRANSPORT FACILITY

CROSS-REFERENCE TO RELATED APPLICATION

This application claims priority to Japanese Patent Application No. 2015-139099 filed Jul. 10, 2015, the disclosure of which is hereby incorporated in its entirety by reference.

FIELD OF THE INVENTION

The present invention relates to an article transport facility including a first transport vehicle configured to travel by means of electricity supplied from a travel path, and a second transport vehicle having a battery and configured to travel by means of electricity supplied from the battery.
Background Art U.S. Pat No. 8,915,690, for example, discloses a transport system in which articles are transported by means of a first transport vehicle (overhead travelling vehicle 2) which operates with electricity supplied from electricity supply lines installed along the travel path, and a second transport vehicle (local vehicle 4) which operates with electricity supplied from a battery installed on the vehicle. This transport system includes a first travel path (an overhead travelling vehicle track 6) along which only the first transport vehicle (overhead travelling vehicle 2) travels and a separately provided second travel path (local track 8) along which only the second transport vehicle (local vehicle 4) travels. In addition, transport system includes an article holder (a buffer 10) to and from which both the first transport vehicle (overhead travelling vehicle 2) and the second transport vehicle (local vehicle 4) can transfer an article.

In this transport system, the transporting of an article from a transport origin (i.e., starting point of the transporting operation) which is a processing device that can transfer articles to or from only the first transport vehicle (overhead travelling vehicle 2) to a transport destination which is a processing device that can transfer articles to or from only the second transport vehicle (local vehicle 4), or vice versa (with roles of the transport origin and the transport destination interchanged), is performed in the following manner, using the article holder (buffer 10). The article is transported from a transport origin to a transport destination by transferring the article between the first transport vehicle (overhead travelling vehicle 2) and the second transport vehicle (local vehicle 4) indirectly by transferring the article between the first transport vehicle (overhead travelling vehicle 2) and the article holder (buffer 10), and between the article holder (buffer 10) and the second transport vehicle (local vehicle 4).

In other words, in this transport system, when transporting an article from a transport origin which is a processing device that can transfer articles to or from only the first transport vehicle (overhead travelling vehicle 2) to a transport destination which is a processing device that can transfer articles to or from only the second transport vehicle (local vehicle 4), or vice versa (with roles of the transport origin and the transport destination interchanged), the transporting of the article from the transport origin to the transport destination cannot be completed only by the first transport vehicle (overhead travelling vehicle 2) or only by the second transport vehicle (local vehicle 4). In this manner of transportation, as described above, the articles must always be placed on the article holder (buffer 10) in order to transfer the articles between the first transport vehicle (overhead travelling vehicle 2) and the second transport vehicle (local vehicle 4). This lowers the transport efficiency.

SUMMARY OF THE INVENTION

In this regard, it is desirable to reduce lowering of the transport efficiency when transporting articles between a transport target location that belongs to, located along, or associated with, a first travel path in which actuating electricity is supplied to transport vehicles and a transport target location that belongs to, located along, or associated with, a second travel path in which actuating electricity is not supplied to transport vehicles.

In one preferable embodiment, an article transport facility comprises: travel paths provided to interconnect a plurality of processing devices; transport vehicles for traveling along the travel paths to transport articles processed by one or more of the plurality of processing devices; a managing member for managing traveling of the transport vehicles;

wherein the travel paths include one or more first travel paths in which electricity is supplied to the transport vehicles, and one or more second travel paths in which electricity is not supplied to the transport vehicles, wherein the transport vehicles include a first transport vehicle configured to travel by means of electricity supplied from the one or more first travel paths, and a second transport vehicle having a battery and configured to travel by means of electricity supplied from the battery;

wherein the one or more first travel paths and the one or more second travel paths are connected to one another directly or indirectly, wherein the managing member is configured: to manage traveling of the first transport vehicle to allow the first transport vehicle to travel only along one or more of the one or more first travel paths; and to manage traveling of the second transport vehicle to allow the second transport vehicle to travel along both one or more of the one or more first travel paths and one or more of the one or more second travel paths.

With the arrangement described above, when both the transport origin (starting point of an transporting operation) and the transport destination for the article are located along a first travel path, the transporting of the article can be completed by one transport vehicle by causing either the first transport vehicle or the second transport vehicle to transport the article. In addition, when both the transport origin and the transport destination for the article are located along a second travel path, the transporting of the article can be completed by one transport vehicle by causing the second travel vehicle to transport the article. Furthermore, the second transport vehicle can travel along both a first travel path and a second travel path which are connected to each other directly or indirectly. Therefore, when the transport origin for the article is located along one of a first travel path and a second travel path, and the transport destination is located along the other of a first travel path and a second travel path, the transporting of the article from the transport origin to the transport destination can be completed by one transport vehicle by causing the second transport vehicle to transport the article. Thus, with the above arrangement, lowering of the transport efficiency can be reduced when transporting an article between a transport target location that belongs to, located along, or associated with, a first travel path in which actuating electricity is supplied to the transport vehicles and a transport target location that belongs to, located along, or associated with, a second travel path in which actuating electricity is not supplied to the transport vehicles.

In addition, the transporting of the article cannot be completed only by the first transport vehicle when one of the transport origin and the transport destination belongs to, is located along, or associated with, a power-supply section in the electricity non-supplying state, or when the transport vehicle needs to travel through a power-supply section in the non-supply state during the travel even if both of the transport origin and the transport destination belong to, are located along, or associated with, power-supply sections in the electricity supplying state. However, even in those situations, by using the second transport vehicle, the article can be transported by a single second transport vehicle without having to have the article relayed between different transport vehicles even if a power-supply section in the electricity non-supplying state exists between the transport origin and the transport destination. In other words, lowering of the transport efficiency can be reduced even if a power-supply section in the electricity non-supplying state exists between the transport origin and the transport destination. As such, the arrangement above can reduce lowering of the operation efficiency and the transport efficiency of the facility.

Any additional features and advantages of the article transport facility will be made clear from the following description of embodiments described with reference to the drawings.

DETAILED DESCRIPTION OF EMBODIMENTS

Embodiments, in which an article transport facility of the present invention is incorporated in a semiconductor processing facility provided with a number of ceiling or overhead transport vehicles, are described with reference to the drawings. Each ceiling or overhead transport vehicle is configured to transport articles, one article at a time, between a plurality of processing devices provided along travel paths. In the present embodiment, an example is described in which each article is a FOUP (Front Opening Unified Pod) for holding or carrying a plurality of semiconductor substrates.

Figure 1:
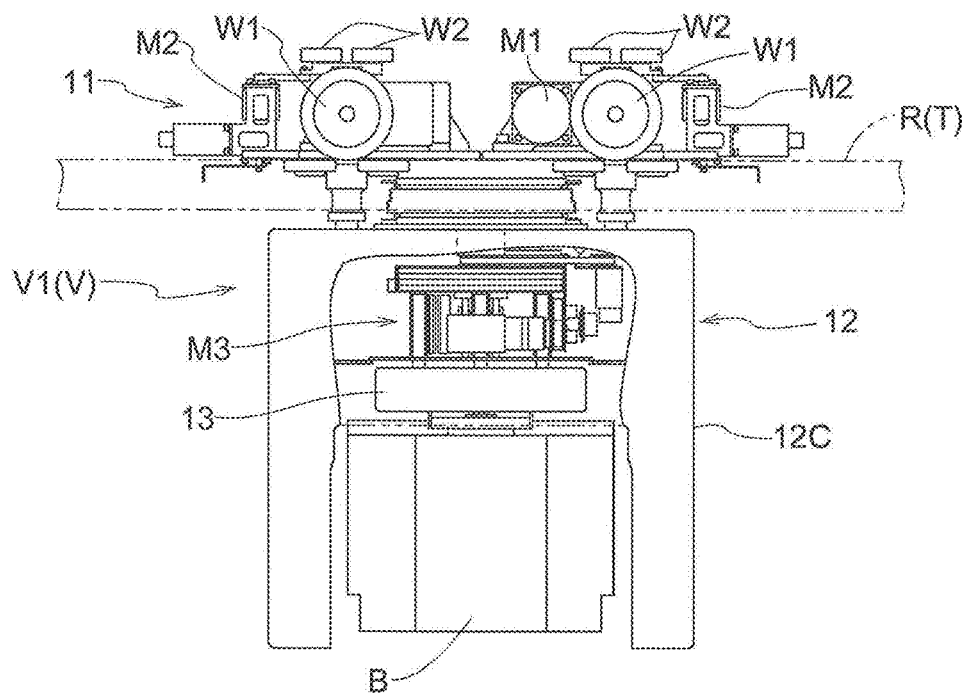
FIG. 1 is a diagrammatic side view of a normal transport vehicle (supplied-electricity-operated transport vehicle) and travel rails.
Figure 2:
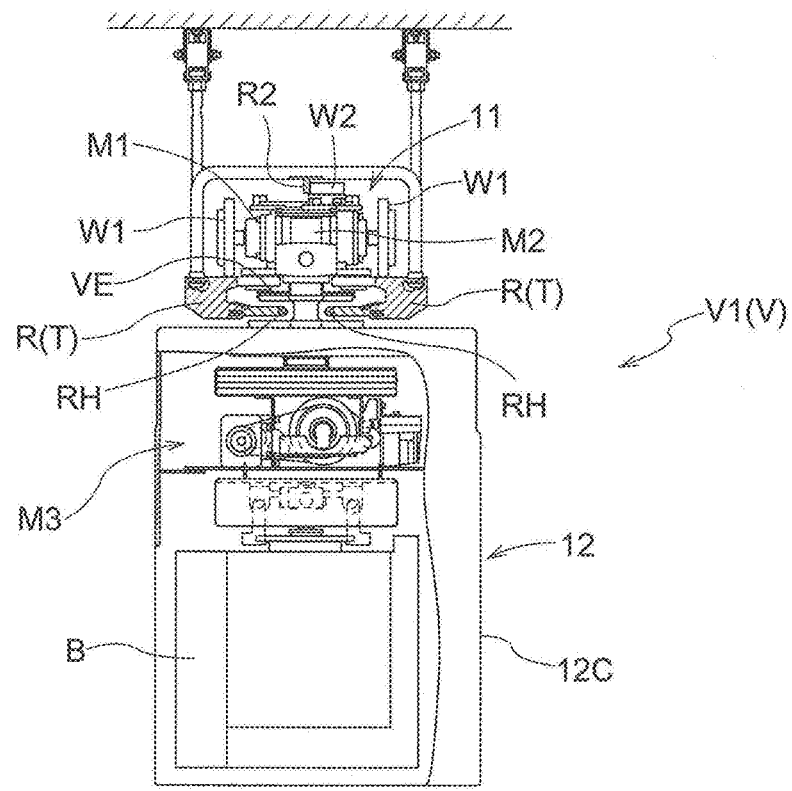
FIG. 2 is a diagrammatic front view of the normal transport vehicle (supplied-electricity-operated transport vehicle) and travel rails.
Figure 3:
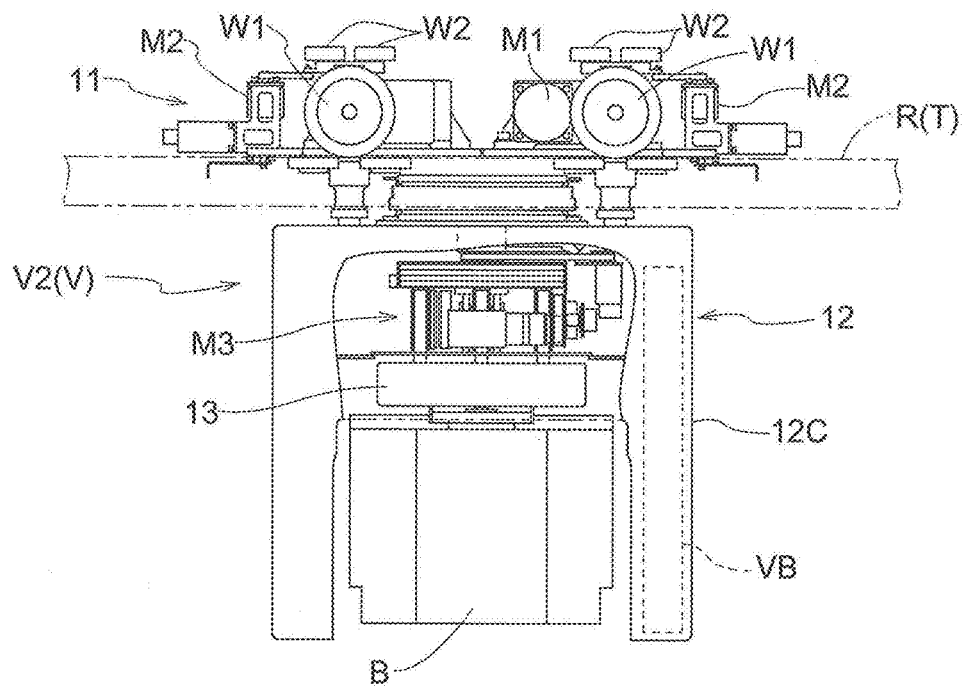
FIG. 3 is a diagrammatic side view of a battery-mounted transport vehicle.
Figure 4:
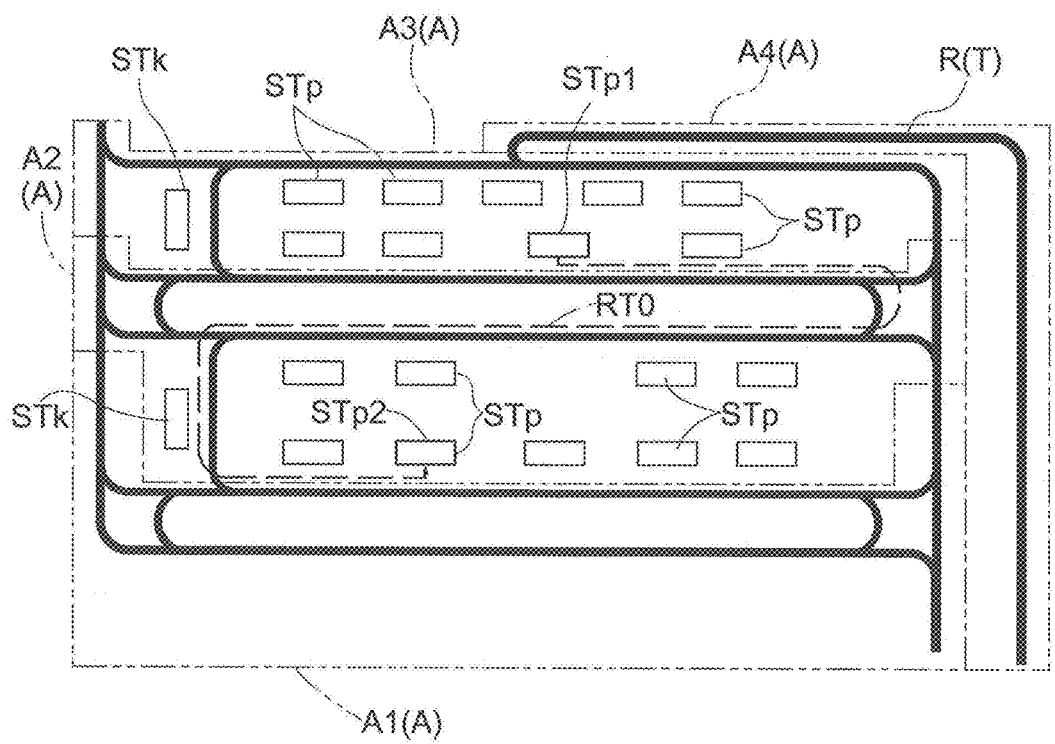
FIG. 4 is a diagrammatic plan view showing travel paths and power-supply areas.

As shown in FIGS. 1-3, the semiconductor processing facility incorporating an article transport facility of the present embodiment, includes transport vehicles V each of which can travel while holding a FOUP as an article B, and travel rails R which are provided along each travel path T and are suspended from and supported by the ceiling. In addition, as shown in FIG. 4, provided along the travel paths T are a plurality of semiconductor processing devices STp each of which performs one or more operations on the semiconductor substrates held or carried by the article B, and a plurality of semiconductor container storage devices STk which can store a plurality of articles B. In order to transport articles B, one at a time, between different semiconductor processing devices STp of the plurality of semiconductor processing devices STp, between different semiconductor container storage devices STk of the plurality of semiconductor container storage devices STk, or between a semiconductor processing device STp and a semiconductor container storage devices STk, each transport vehicle V is configured to travel on and along the travel rails R while holding an article B received from a transport origin (i.e., location where the article is picked up) which may be a semiconductor processing device STp or a semiconductor container storage device STk, to transport the article to a transport destination (i.e., destination of the transport operation) which may be a semiconductor processing device STp or a semiconductor container storage device STk. Any one of the semiconductor processing devices STp and any one of the semiconductor container storage devices STk can be, or, correspond to, a processing device that is designated as the transport origin or the transport destination.

The transport vehicle V has a command receiving portion (not shown) for receiving commands from a managing device K (FIG. 6) that manages (i.e., performs control to carry out or accomplish) processing and/or handling schedule for the articles B in the semiconductor processing facility and transporting of the articles B between locations such as the semiconductor processing devices STp and the semiconductor container storage devices STk. Each of the managing device K (managing member) and other controllers in the present application may include a microcomputer or an IC circuitry with a memory and communication circuitry and with algorithms stored in the memory to perform various operations and functions described in the present application. In the present embodiment, the semiconductor container storage devices STk and the semiconductor processing devices STp are, or correspond to, processing devices whereas the managing device K is, or corresponds to, the managing member. In other words, a semiconductor processing device (article transport facility) comprises: travel paths T provided to interconnect a plurality of processing devices; transport vehicles V for traveling along the travel paths T to transport articles B processed by one or more of the plurality of processing devices; a managing device K for managing travel of the transport vehicles V. Here, the expression, "travel paths T provided to interconnect a plurality of processing devices", means that travel paths T are provided such that objects/articles can be transported along the travel paths T from one processing device to another of the plurality of processing devices. In addition, the expression, "processed by a processing device", when used to describe or modify an article B such as in the expression, "articles B processed by one or more of the plurality of processing devices", is used to refer to an article B on which one or more operations have been, or are to be performed by the processing device OR an article B for which one or more operations have been or are to be performed by the processing device on one or more objects (such as, one or more semiconductor substrates in the present embodiment) held in the article B, after the one or more objects are removed from the article B. Therefore, when the processing device is a storage device, an article B "processed" by a processing device refers to an article B that is, or to be, stored in the storage device whereas, when the processing device is a semiconductor processing device, an article B "processed" by a processing device refers to an article for which one or more objects (such as, one or more semiconductor substrates in the present embodiment) held in the article B have been, or are to be, processed (e.g., etched, chemically treated, cleaned, among other processes done on substrates) by the semiconductor processing device, after the objects are removed from the article B and moved into the processing device.

As shown in FIG. 2, electricity supply lines RH (electricity supplying members) for supplying motive electricity (i.e., motive electric power) to the transport vehicle V are provided along the travel rails R. Each electricity supply line RH is supported by the corresponding travel rail R through a support member formed of an insulating material. In addition, induction-coils VE in each of which induced current is generated by the changing magnetic fields around the electricity supply lines RH are mounted to the transport vehicle V. The induction-coils VE are used to obtain or collect electricity required for the operation of (such as traveling of) the transport vehicle V from the electricity supply lines RH without contacting the electricity supply lines RH. In the present embodiment, obtaining (or supplying) induced current by means of the induction-coils VE and changing magnetic fields around the electricity supply lines RH will be referred to hereinafter as receiving (or supplying) electricity from the electricity supply lines RH.

In the present embodiment, the transport vehicle V can be either a supplied-electricity-operated transport vehicle V1 (see FIGS. 1 and 2) which operates with electricity received from the electricity supply lines RH as described above, or a battery-operated transport vehicle V2 (see FIG. 3) which does not receive electricity from the electricity supply lines RH and which, instead, operates with electricity from a battery VB mounted on the transport vehicle V.

As shown in FIGS. 1 and 2, each supplied-electricity-operated transport vehicle V1 includes a travel portion 11 having travel wheels W1 for traveling on the travel rails R, and a main body portion 12 which is suspended from, and thus supported by, the travel portion 11. The travel portion 11 further includes steering guide wheels W2 that are used to change the traveling direction of the travel portion 11 at branching portions of the travel rails R. The steering guide wheels W2 are adapted to come into contact with one of two side faces of a guide rail (not shown) provided along the travel rails R, and to change the traveling direction of the travel portion 11 at branching portions of the travel rails R by switching the side face of the guide rail that the steering guide wheels W2 come into contact with. In addition, the travel portion 11 includes a travel actuator M1 for drivingly rotating the above-mentioned travel wheels W1, and steering actuators M2 for changing the positions of the above-mentioned steering guide wheels W2.

Figure 6:
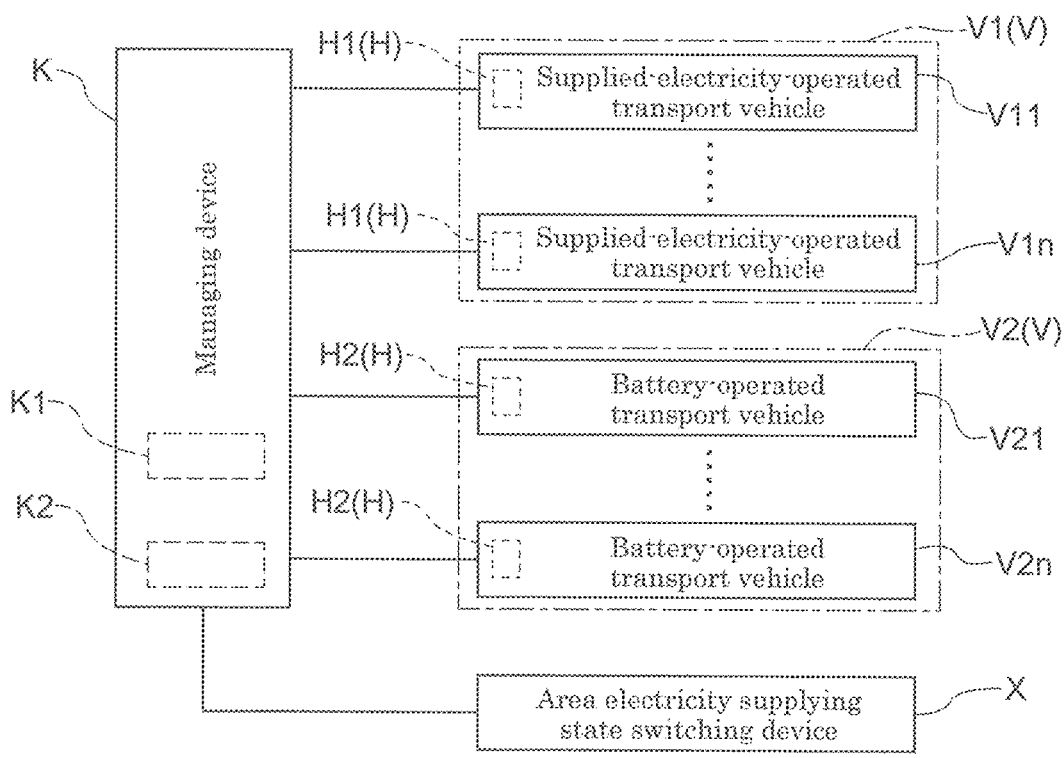
FIG. 6 is a control block diagram.

The main body portion 12 includes a cover portion 12C, and a vertically movable portion 13 which is moved vertically by a vertical movement actuator M3 which is supported by the cover portion 12C. While not shown, the vertically movable portion 13 has a grip portion for gripping or holding a flange provided in the upper end of the FOUP as the article B. The grip portion is configured to be capable of being switched between a gripping state for gripping the flange and a gripping release state for releasing the grip on the flange. Each of the travel actuator M1, the steering actuators M2, and the vertical movement actuator M3 includes an electric actuator (not shown) such as an electric motor and thus is actuated by electricity. In addition, as shown in FIG. 6, a first controller H1 is mounted on each supplied-electricity-operated transport vehicle V1 as a controller H that controls operations of the travel actuator M1, the steering actuators M2, and the vertical movement actuator M3. Each supplied-electricity-operated transport vehicle V1 is controlled by the first controller H1 such that it can travel autonomously.

The battery-operated transport vehicle V2 shown in FIG. 3 is designed using the basic structure of the supplied-electricity-operated transport vehicle V1. Each battery-operated transport vehicle V2 has a battery VB mounted thereon. And the travel actuator M1, the steering actuators M2, and the vertical movement actuator M3, among other electrical components, are operated by the electricity supplied from the battery VB, instead of the electricity obtained by the induction-coils VE. Although induction-coils VE are mounted also on each battery-operated transport vehicle V2, they are used to charge the battery VB at a charge station CH (see FIG. 5) described below. In other words, induction-coils VE are used to obtain the electricity supplied to battery VB from electricity supply lines RH of the charge station CH. Each battery-operated transport vehicle V2 uses electricity from the battery VB, and not the electricity obtained by the induction-coils VE, to operate the travel actuator M1, the steering actuators M2, and the vertical movement actuator M3 of the battery-operated transport vehicle V2. In addition, as shown in FIG. 6, a second controller H2 is mounted on each battery-operated transport vehicle V2 as a controller H that controls operations of the travel actuator M1, the steering actuators M2, and the vertical movement actuator M3. Each battery-operated transport vehicle V2 is controlled by the second controller H2 such that it can travel autonomously.

Note that although each battery-operated transport vehicle V2 has been described above to use electricity supplied from the battery VB, instead of the electricity obtained by the induction-coils VE, to operate the travel actuator M1, the steering actuators M2, and the vertical movement actuator M3, these actuators, among other electical components, may be operated by the electricity from the battery VB and the electricity obtained by the induction-coils VE. For example, when in, or traveling along, a first travel path T1, the battery-operated transport vehicle V2 may cause the travel actuator M1, the steering actuators M2, and the vertical movement actuator M3 to be operated with the electricity obtained by the induction-coils VE. In addition, when in, or traveling along, a first travel path T1, the battery-operated transport vehicle V2 may charge the battery VB with surplus electricity while causing the travel actuator M1, the steering actuators M2, and the vertical movement actuator M3 to be operated by the electricity obtained by the induction-coils VE. Alternatively, when in, or traveling along, a first travel path T1, the battery-operated transport vehicle V2 may charge the battery VB with the electricity obtained by the induction-coils VE while causing the travel actuator M1, the steering actuators M2, and the vertical movement actuator M3 to be operated by the electricity supplied from the battery VB.

In the present embodiment, travel rails R are provided to be continuous as shown in FIG. 4. Therefore, the transport vehicles V can travel on these travel rails R continuously. In addition, the electricity supply lines RH (electricity supplying members) are provided along the travel rails R. Therefore, when transporting an article B from the first semiconductor processing device STp1 shown in FIG. 4 to the second semiconductor processing device STp2, for example, the supplied-electricity-operated transport vehicle V1 holding the article B can be caused to travel along the route shown at RTO, for example. In other words, the article B can be transported from the transport origin (first semiconductor processing device STp1) to the transport destination (second semiconductor processing device STp2) using only the supplied-electricity-operated transport vehicle V1.

Incidentally, electricity is supplied to such electricity supply lines RH as those used in the present embodiment, from a rectifier that controls voltage and frequency for proper output for the electricity supplying members. Here, as the length of the electricity supply lines RH increases, the loss of the electricity due to resistance in the lines, etc. increases, which reduces the electricity supplying efficiency. In this regard, in the present invention, in order to keep the line length of the electricity supply lines RH equal to or below a set length, the electricity supply lines RH are divided into shorter segments that correspond to a number of areas A (four areas, namely, the first area A1, the second area A2, the third area A3, and the fourth area A4 in the example shown in FIGS. 4 and 5). And one rectifier is provided to each of the areas A. In addition, an area electricity supplying state switching device X (FIG. 6) causes each of the areas A to be switched between a supplying state in which electricity is supplied to electricity supply lines RH and a non-supplying state in which electricity is not supplied, by switching the rectifiers individually.

Figure 5:
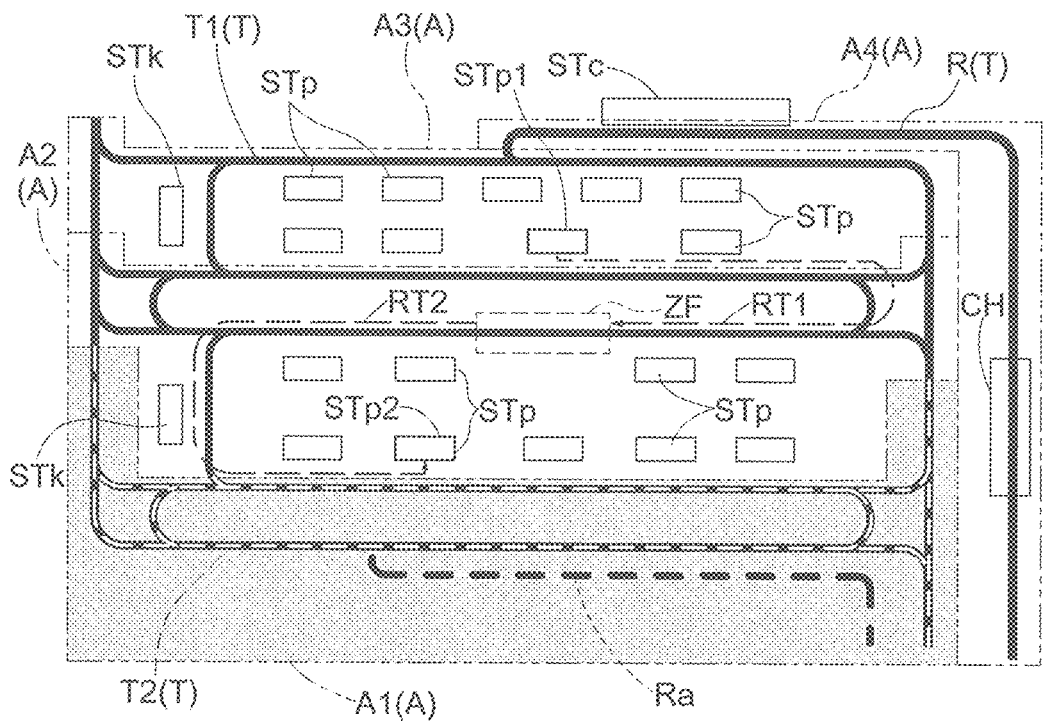
FIG. 5 shows an area in which the supplying of electricity is stopped to perform a travel rail installation work.

For example, in the example shown in FIG. 5, the second area A2, the third area A3, and the fourth area A4 are the areas A (which cover power-supply sections) in the supplying state whereas the first area A1 is an area A (power-supply section) in the non-supplying state. Each travel path T, among the travel paths T, that belongs to an area A (power-supply section) in which electricity supply lines RH (electricity supplying members) installed along the travel rails R are in the supplying state will be referred to as a first travel path T1. In addition, each travel path T, among the travel paths T, that belongs to an area A in which electricity supply lines RH (electricity supplying members) installed along the travel rails R are in the non-supplying state will be referred to as a second travel path T2 (each of the travel paths that are indicated with solid dotted lines). In other words, the electricity supply lines RH (electricity supplying members) of a first travel path T1 consist of one or more power-supply sections in the supplying state whereas the electricity supply lines RH (electricity supplying members) of a second travel path T1 consist of one or more power-supply sections in the non-supplying state. In addition, as described in more detail below, an supplied-electricity-operated transport vehicle V1 is, or correspond to, the first transport vehicle whereas a battery-operated transport vehicle V2 is, or correspond to, a second transport vehicle.

In other words, the travel paths T include one or more first travel paths T1 in each of which electricity is supplied to the transport vehicle V and one or more second travel paths T2 in each of which electricity is not supplied to the transport vehicle V. The electricity supply lines RH are installed over the entire length of each of the first travel paths T1 and each of the second travel paths T2, and along the longitudinal direction along which the corresponding travel path T extends. And the first travel paths T1 are connected to the second travel paths T2 and vice versa either directly or indirectly. In addition, the semiconductor processing facility (article transport facility), has, as the transport vehicles V, supplied-electricity-operated transport vehicles V1 each of which travels with electricity supplied from first travel paths T1, and battery-operated transport vehicles V2 each of which has a battery VB mounted thereon and travels with electricity supplied from the battery VB. The electricity supply lines RH which supply electricity to transport vehicles V which travel along the travel path T are installed over the entire length of the first travel paths T1 and over the entire length of the second travel paths T2, and along the direction in which the corresponding travel path T extends. In addition, each power-supply section of the electricity supply lines RH is configured to be capable of being individually switched between the supplying state for supplying electricity and the non-supplying state for not supplying electricity.

The control performed by the managing device K is described next. The managing device K is configured to select, based on a transport schedule, either a supplied-electricity-operated transport vehicle V1 or a battery-operated transport vehicle V2 as the transport vehicle V assigned to perform a transport, and is configured to issue or output a transport command to the selected transport vehicle V (referred to as an assigned transport vehicle). Note that a transport command is a command issued to a transport vehicle V for causing the transport vehicle V to transport an article B from a processing device (a semiconductor processing device STp or a semiconductor container storage device STk) of transport origin (i.e., processing device that is the transport origin) for the article B to a processing device (a semiconductor processing device STp or a semiconductor container storage device STk) of transport destination for the article B.

The managing device K includes a permitted section definition data holding portion K1 which stores permitted section definition data which specify sections (travel-permitted sections) along the travel paths V in which a given transport vehicle V is allowed to travel, for each transport vehicle V. As described below, the permitted section definition data is used when the managing device K determines an assigned transport vehicle. The permitted section definition data holding portion K1 is provided in a form of a folder in a storage device (e.g., a hard disk), and stores the permitted section definition data for each transport vehicle V in this folder as individual and separate files. In addition, each transport vehicle V stores its own permitted section definition data in its controller H. Each transport vehicle V determines the sections along the travel paths T in which it is permitted to travel, based on the permitted section definition data stored therein. And each transport vehicle V is controlled by its controller H to travel through those sections autonomously. In addition, the managing device K includes, in a form of a computer program, a data update determination portion K2 which determines that the permitted section definition data has been updated based on the time of the latest update (latest update time information).

Figure 7:
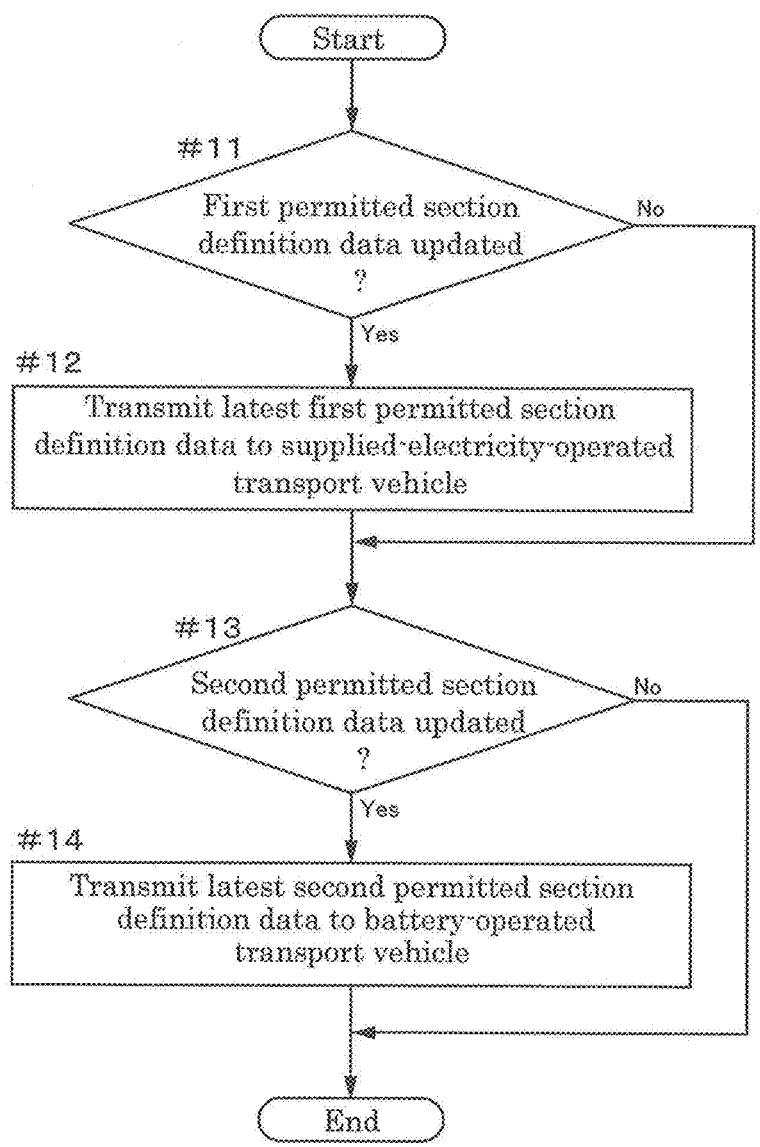
FIG. 7 is a flowchart showing a control for updating permitted section definition data which indicates sections in which traveling is permitted.

Incidentally, since the electricity supply lines RH are installed along travel rails R, when, for example, some work needs to be performed on travel rails R (work performed on travel paths T, such as work to replace rails or to install new rails), it is preferable to place in the non-supplying state the electricity supply lines RH in the power-supply section that includes, or corresponds to, the location of such work and its surrounding area. More specifically, for example, as shown in FIG. 5, when performing work such as when installing new travel rails Ra that are continuous with, and extend from, the travel rails R that belong to the first area A1 of the plurality of areas A, or when replacing the travel rails R that belong to the first area A1, electricity supplied to the electricity supply lines RH in the location of such work is stopped. In other words, the first area A1, among the four areas A shown in FIG. 5, becomes an area in which the power-supply section is in the non-supplying state. Referring to FIG. 7, a control is described next for transporting an article B from the first semiconductor processing device STp1 to the second semiconductor processing device STp2 with the electricity supply lines RH in the first area A1 switched to the non-supplying state.

First permitted section definition data and second permitted section definition data are stored as permitted section definition data in the permitted section definition data holding portion K1. The first permitted section definition data specifies first travel-permitted sections which are sections in the travel paths T in which the supplied-electricity-operated transport vehicles V1 are permitted to travel. The second permitted section definition data specifies second travel-permitted sections which are sections in the travel paths T in which the battery-operated transport vehicles V2 are permitted to travel.

In the present embodiment, each travel path T is divided into a number of sections along the longitudinal direction along which the path extends, and a distinguishing identification code is given to each section. (These sections do not have to be physically divided and may be physically continuous.) The permitted section definition data is in a form of data containing a list of identification codes of the sections in which the transport vehicle V is permitted to travel, for each transport vehicle V. More specifically, the first permitted section definition data for a given supplied-electricity-operated transport vehicle V1 contains a list of section identification codes of the sections of the first travel paths T1 in which the supplied-electricity-operated transport vehicle V1 is permitted to travel. In addition, the second permitted section definition data for a given battery-operated transport vehicle V2 contains a list of section identification codes of the sections of the first travel paths T1 in which the battery-operated transport vehicle V2 is permitted to travel as well as a list of section identification codes of the sections of the second travel paths T2 in which the battery-operated transport vehicle V2 is permitted to travel.

Furthermore, the managing device K stores section identification codes of the sections that correspond to the first travel paths T1 and location information of processing devices (each of which can be either a semiconductor processing device STp or a semiconductor container storage device STk) in those sections as well as section identification codes of the sections that correspond to the second travel paths T2 and location information of processing devices (each of which can be either a semiconductor processing device STp or a semiconductor container storage device STk) in those sections. In the present embodiment, the first permitted section definition data contains a list of the section identification codes of the sections that correspond to the second area A2, third area A3, and the fourth area A4 in FIG. 5 whereas the second permitted section definition data contains a list of the section identification codes of the sections that correspond to all of the first area A1 through the fourth area A4.

In other words, the managing device K is configured to store the first permitted section definition data which specify first travel-permitted sections of the travel paths in which supplied-electricity-operated transport vehicles V1 are permitted to travel as well as the second permitted section definition data which specify second travel-permitted sections of the travel paths in which battery-operated transport vehicles V1 are permitted to travel. In addition, the first travel-permitted sections include only the first travel paths whereas second travel-permitted sections includes both the first travel paths and the second travel paths. In addition, the managing device K stores location information of the processing devices (each of which can be either a semiconductor processing devices STp or a semiconductor container storage device STk) that correspond to, or are located along, the first travel paths T1 and location information of the processing devices that correspond to, or are located along, the second travel paths T2, among the plurality of processing devices.

Before switching the electricity supply lines RH (in the first area A1 in which a section in which work is done) to the non-supplying state by means of the area electricity supplying state switching device X, a worker saves the first permitted section definition data and the second permitted section definition data in the folder that functions as the permitted section definition data holding portion K1. If permitted section definition data is already in the folder at this time, new permitted section definition data is saved over the old data.

As shown in FIG. 7, if the data update determination portion K2 determines that the first permitted section definition data have been updated, based on the time of the latest update (latest update time information) for the first permitted section definition data (Step #11- "Yes"), then the data update determination portion K2 transmits new first permitted section definition data to supplied-electricity-operated transport vehicles V1 (Step #12). The first controller H1 of each supplied-electricity-operated transport vehicle V1 which received the first permitted section definition data controls the supplied-electricity-operated transport vehicle V1 to cause it to travel within the first travel-permitted sections, based on the first permitted section definition data transmitted from the managing device K.

In addition, if the data update determination portion K2 determines that the second permitted section definition data have been updated, based on the time of the latest update (latest update time information) for the second permitted section definition data (Step #13- "Yes"), then the data update determination portion K2 transmits new second permitted section definition data to battery-operated transport vehicles V2 (Step #14). The second controller H1 of each battery-operated transport vehicle V2 which received the second permitted section definition data controls the battery-operated transport vehicle V2 to cause it to travel within the second travel-permitted sections, based on the second permitted section definition data transmitted from the managing device K.

Further, as shown in FIG. 5 with dashed lines, an article holder ZF, to or from which each of the supplied-electricity-operated transport vehicles V1 and battery-operated transport vehicles V2 can transfer an article B, is provided along the first travel path T1. This article holder ZF may be attachable and detachable or otherwise temporarily provided during the work or maintenance. This article holder ZF is provided at the position (for example, directly under the travel rails R) at which an article B can be transferred to and from the grip portion provided to the vertically movable portion 13 of the transport vehicle V which is a ceiling or overhead transport vehicle. In addition, if the grip portion of the transport vehicle V is configured to move or slide along the lateral direction that is perpendicular to the direction of the travel rails R in plan view (i.e., as seen along the vertical direction), the article holder ZF may be displaced to one side of the travel rails R.

As described above, the supplied-electricity-operated transport vehicles V1 cannot travel along the second travel paths T2. Therefore, when transporting an article with the first semiconductor processing device STp1 along the first travel path T1 being designated as the transport origin and the second semiconductor processing device STp2 along the second travel path T2 being designated as the transport destination, and when a supplied-electricity-operated transport vehicle V1 is selected as the assigned transport vehicle, the article B being transported needs to be handed over from the supplied-electricity-operated transport vehicle V1 to a battery-operated transport vehicle V2. Therefore, the managing device K divides a transport command into a transport command for the first half of the transport operation and a transport command for the second half of the transport operation, and outputs the transport command for a first half to the supplied-electricity-operated transport vehicle V1 and outputs the transport command for the second half to a battery-operated transport vehicle V2. An example of this control by the managing device K is described with reference to FIG. 8.

First, the managing device K generates a transport command which is a command for transporting the article B from the processing device (the first semiconductor processing device STp1) of the transport origin for the article B to the processing device (the second semiconductor processing device STp2) of the transport destination for the article B (Step #21: command generating operation). Then, the managing device K determines whether the transport origin (first semiconductor processing device STp1) belongs to, is located along, or associated with, a first travel path T1 (Step #22), and if it determines that the transport origin (first semiconductor processing device STp1) belongs to, is located along, or associated with, a first travel path T1 (Step #22—"Yes"), the managing device K selects a supplied-electricity-operated transport vehicle V1 as the assigned transport vehicle (Step #23: selecting operation).

Subsequently, the managing device K determines whether the processing device (second semiconductor processing device STp2) that is the transport destination belongs to, is located along, or associated with, the second travel path T2 (Step #24). For example, if the managing device K determines that the transport destination does not belong to, is not located along, or otehwise associated with, the second travel path T2, i.e., that the transport destination belongs to, is located along, or otehwise associated with, the first travel path T1 (Step #24—"No"), the managing device K outputs the transport command generated in Step #21 to the assigned transport vehicle (in this case, the supplied-electricity-operated transport vehicle V1) (Step #31: command output operation). The supplied-electricity-operated transport vehicle V1 then transports the article B from the transport origin to the transport destination.

The transport destination in the present embodiment is the second semiconductor processing device STp2 belonging to, located along, or associated with, the second travel path T2. If the managing device K determines that the transport destination (the second semiconductor processing device STp2) belongs to, is located along, or otehwise associated with, the second travel path T2, the managing device K determines that the article B needs to be a relayed, or transferred, from one vehicle to another and designates a transport destination for the relaying of the article B (i.e., the destination for the first half of the transport operation, or a first half transport destination). In other words, the managing device K designates the article holder ZF as the first half transport destination (Step #25: Relaying point designating operation). And the managing device K generates a first half transport command for causing the supplied-electricity-operated transport vehicle V1 to transport the article B from the transport origin (first semiconductor processing device STp1) to the article holder ZF and to transfer the article B onto the article holder ZF, and outputs the first half transport command to the first controller H1 of the supplied-electricity-operated transport vehicle V1 (Step #26: Command generating operation, command output operation).

When the transporting of the article B to article holder ZF is completed, the first controller H1 of the supplied-electricity-operated transport vehicle V1 notifies the managing device K of the completion of the transporting. The managing device K determines based on this notification whether the supplied-electricity-operated transport vehicle V1 completed the transporting of the article B to the article holder ZF (Step #27). When the managing device K determines that the transporting of the article B to the article holder ZF has been completed (Step #27—"Yes"), the managing device K selects a battery-operated transport vehicle V2 as the assigned transport vehicle which is assigned to transport the article B (Step #28: Selecting operation). Subsequently, the managing device K generates a second half transport command for having the article B transferred from the article holder ZF and transported to the processing device of the transport destination (the second semiconductor processing device STp2) and outputs the second half transport command to the second controller H2 of the battery-operated transport vehicle V2 (Step #29: Command generating operation, command output operation).

Incidentally, when two or more article holders ZF exist along the path from the transport origin to the transport destination, an article holder ZF that does not have any article B on it is selected as the transport destination in the first half transport command. It is preferable to select, for example, the article holder ZF nearest to the final transport destination (processing device) among the unoccupied article holders ZF. In other words, it is preferable to transport the article B as far as possible (to a location near the final transport destination (processing device)) by the supplied-electricity-operated transport vehicle V1 which can collect or draw electricity during the travel. Selection of such article holder ZF may be specified by the managing device K as the transport destination in the first half transport command, or may be left to the autonomous control by the first controller H1 of the supplied-electricity-operated transport vehicle V1. Since each transport vehicle V transports an article B through an autonomous control, an article holder ZF which was occupied at the time of the generation of the first half transport command by the managing device K may become available after the supplied-electricity-operated transport vehicle V1 starts to transport the article. A more proper selection may be made if the article holder ZF to be designated as the transport destination is selected through the autonomous control of the supplied-electricity-operated transport vehicle V1. When the supplied-electricity-operated transport vehicle V1 makes the selection of the article holder ZF, it is preferable to have the first controller H1 transmit identifying information of the article holder ZF to which the article B is transferred, to the managing device K. The managing device K generates a transport command for the second half of the transport operation (second half transport comman) in which the article holder ZF that corresponds to, or specified by, the identifying information is designated as the transport origin for the battery-operated transport vehicle V2, and outputs this command to the battery-operated transport vehicle V2.

If the managing device K determines in Step 22 that the processing device of the transport origin does not belong to, is not located along, or associated with, the first travel path T1, i.e., that the processing device of the transport origin belongs to, is located along, or associated with, the second travel path T2 (Step #22—"No"), the managing device K selects a battery-operated transport vehicle V2 as the assigned transport vehicle (Step #30: Selecting operation). The managing device K outputs the transport command generated in Step #21 to the second controller H2 of the battery-operated transport vehicle V2 (Step #31: Command output operation). In other words, the managing device K controls a battery-operated transport vehicle V2 such that the article B is transported from the processing device of transport origin to the processing device of the transport destination, solely by the battery-operated transport vehicle V2. Here, if the processing device of the transport destination belongs to, is located along, or associated with, the first travel path T1, the article B can transported to the transport destination by a supplied-electricity-operated transport vehicle V1 by relaying the article at the article holder ZF. However, the flowchart of FIG. 8 shows an example embodiment in which the determination as to whether the transport destination belongs to, is located along, or associated with, the first travel path T1 is not made if the transport origin belongs to, is located along, or associated with, the second travel path T2, in order to reduce lowering of the transport efficiency caused by the relaying of the article.

As such, the managing device K is configured to manage or oversees the travel of the supplied-electricity-operated transport vehicles V1 such that each supplied-electricity-operated transport vehicle V1 would travel only along the first travel paths T1 (of the first travel paths T1 and the second travel paths T2), and to manage or oversees the travels of the battery-operated transport vehicles V2 such that each battery-operated transport vehicle V2 travels along and through both the first travel paths T1 and the second travel paths T2.

Figure 8:
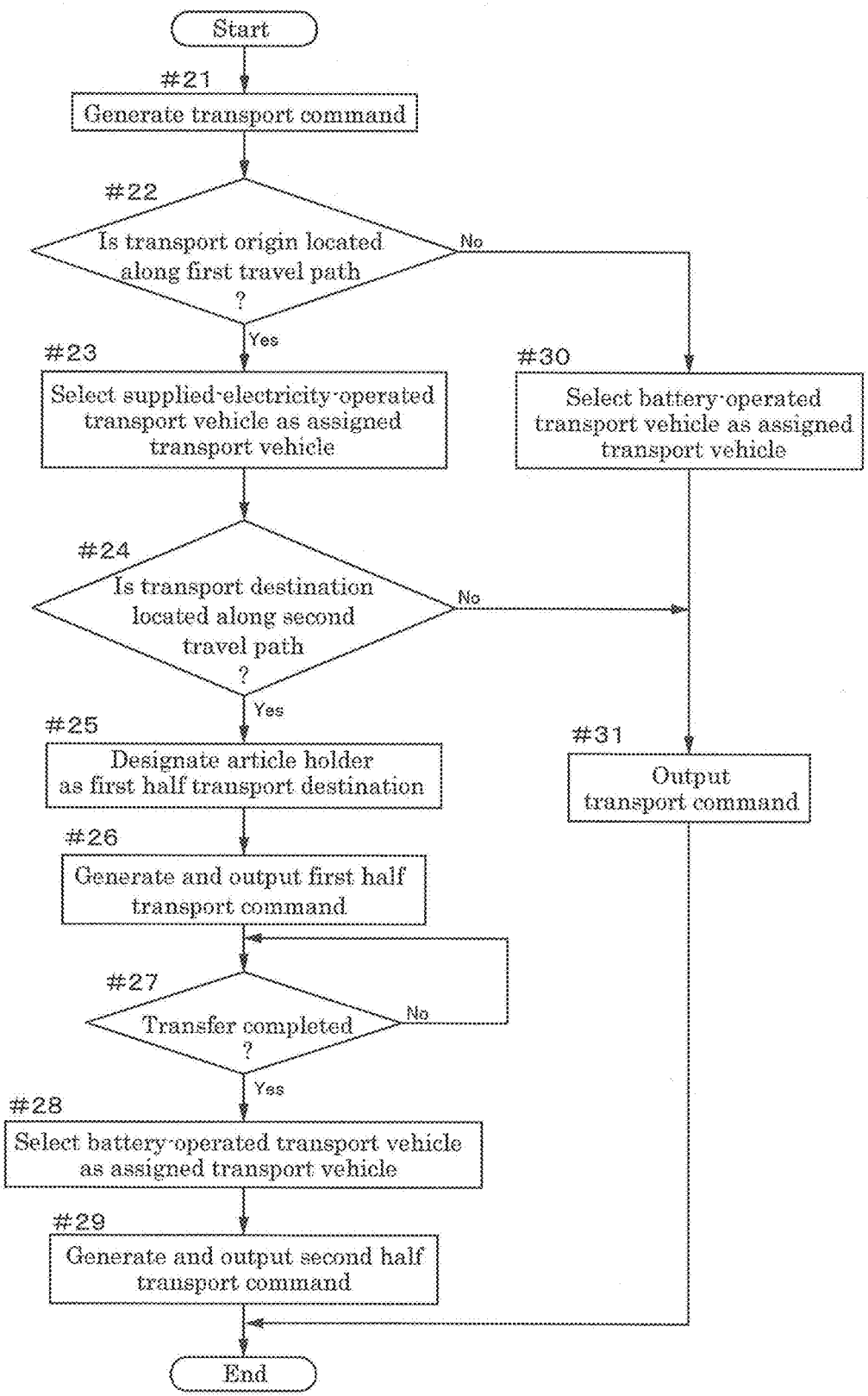
FIG. 8 is a flowchart showing how a transport command is generated and outputted by a managing device.

In addition, in the present embodiment, the operation of each of Step #21, Step #26, and Step #29 in the flowchart of FIG. 8 is, or corresponds to, a command generating operation. The operation of each of Step #23, Step #28, and Step #30 is, or corresponds to, a selecting operation. And the operation of Step #26, Step #29, and Step #31 is, or corresponds to, a command output operation. As described above, the managing device K (managing member) stores the location information of the processing devices corresponding to, located along, or associated with, the first travel paths T1, and the location information of the processing devices corresponding to, located along, or associated with, the second travel paths T2, and performs command generating operations, selecting operations, and command output operations. In other words, the managing device K performs a command generating operation to generate a transport command for transporting an article B from a processing device of the transport origin for the article B to a processing device of the transport destination for the article B, a selecting operation to select an assigned transport vehicle (from the plurality of transport vehicles V) which is a transport vehicle V that is assigned to perform the transporting of the article B specified in the transport command, and a command output operation to output the transport command to the transport vehicle V selected in the selecting operation. The managing device K: selects, in a selecting operation, either a supplied-electricity-operated transport vehicle V1 or a battery-operated transport vehicle V2, as the assigned transport vehicle when the processing device that is the transport origin specified in a transport command is located along a first travel path T1 based on the location information for the processing device; and selects a battery-operated transport vehicle V2 as the assigned transport vehicle when the processing device that is the transport origin specified in the transport command is located along a second travel path T2.

Furthermore, for a transporting operation of an article B in which a processing device located along a first travel path T1 is the transport origin and in which a processing device located along a second travel path T2 is the transport destination, the managing device K is configured: to output to the first controller H1 a first half transport command for operating a supplied-electricity-operated transport vehicle V1 to transport the article B from the processing device of the transport origin to the article holder ZF and to have the article B transferred to the article holder ZF; and to output to the second controller H2 a second half transport command for operating a battery-operated transport vehicle V2 to have the article B transferred from the article holder ZF to the vehicle V2 and to transport the article B to the processing device of the transport destination.

In the embodiment described with reference to FIG. 8, an example was described in which, when the processing device of transport origin is located along a first travel path T1, only a supplied-electricity-operated transport vehicle V1 is selected, or both a supplied-electricity-operated transport vehicle V1 and a battery-operated transport vehicle V2 are selected, as assigned transport vehicles whereas when the processing device of transport origin is located along the second travel path T2, only a battery-operated transport vehicle V2 is selected as the assigned transport vehicle. More specifically, an example was described in which, when the processing device of transport origin is located along a first travel path T1, only a supplied-electricity-operated transport vehicle V1 is selected, or both a supplied-electricity-operated transport vehicle V1 and a battery-operated transport vehicle V2 are selected, as assigned transport vehicles, depending on the location of the processing device of transport destination whereas, when the processing device of transport origin is located along the second travel path T2, only a battery-operated transport vehicle V2 is selected as the assigned transport vehicle, regardless of the location of the processing device of transport destination. Note that a specific example in which the selection of the assigned transport vehicle depends on the location of the processing device of transport destination was the case in which, when the processing device of transport destination is located along a first travel path T1, only a supplied-electricity-operated transport vehicle V1 is selected whereas, when the processing device of transport destination is located along a second travel path T2, both a supplied-electricity-operated transport vehicle V1 and a battery-operated transport vehicle V2 are selected as assigned transport vehicles.

However, the selection of the assigned transport vehicle for when the processing device of transport origin is located along the first travel path T1 does not always have to depend on the location of the transport destination, and may depend on, among other factors, the distance along the travel path between each transport vehicle V and the processing device of transport origin, or the amount of remaining electricity (i.e., charge) in the battery VB of each battery-operated transport vehicle V2. For example, in an article transport facility of a semiconductor processing facility etc., the transport efficiency may be improved by reducing the amount of traveling time of the transport vehicles V. In other words, the transport efficiency of the entire facility may be improved if the managing device K controls a transport vehicle V located near the processing device of transport origin to promptly travel to the transport origin to receive the article B to be transported. Therefore, an arrangement may be preferable in which, when the processing device of transport destination is located along a first travel path T1, the assigned transport vehicle is selected based on the distance along the travel path between each transport vehicle V and the processing device of transport origin. More specifically, it may be preferable to select, as the assigned transport vehicle, the transport vehicle V for which the distance along the travel path between the transport vehicle V and the processing device of transport origin is the shortest.

There would not be any problem to select a battery-operated transport vehicle V2 as the assigned transport vehicle regardless of the location of the processing device of transport destination, since a battery-operated transport vehicle V2 can travel along both a first travel path and a second travel path. Note that, when a supplied-electricity-operated transport vehicle V1 is selected as an assigned transport vehicle and the transport destination is a processing device along a second travel path T2, then the article B is transported by relaying it at the article holder ZF as described with reference to FIG. 8. Although the relaying of the article B lowers the transport efficiency, it improves the transport efficiency up to the point the article B is received by the article holder ZF, and lowers the consumption of electricity from the battery VB of a battery-operated transport vehicle V2 as describe below, which may lead to reduction in the amount of time during which the battery-operated transport vehicle V2 is unavailable for use due to recharging of the battery.

As described above, a battery-operated transport vehicle V2 can be used regardless of the location of the processing device of transport origin and can thus be used more flexibly; however, on the other hand, there is a limit on the capacity of battery VB in terms of the amount of electricity it can store. Thus, when selecting the assigned transport vehicle for when the processing device of transport origin is located along a first travel path T1, it would be preferable to also take into consideration the amount of the remaining electricity (i.e., charge) in the battery VB of each battery-operated transport vehicles V2 that are available for the selection. In other words, it is preferable that, when the processing device of transport origin is located along a first travel path T1, a transport vehicle V for which the distance along the travel path between the transport vehicle V and the processing device of transport origin is the shortest is selected as a candidate for the assigned transport vehicle, and that, if this candidate transport vehicle V is a battery-operated transport vehicle V2, this battery-operated transport vehicle V2 is selected as the assigned transport vehicle if the amount of the remaining electricity (i.e., charge) in its battery VB is greater than or equal to a threshold value specified in advance.

In addition, when the electrical capacity of the battery VB of the battery-operated transport vehicle V2 is large, or when the battery VB can be charged while the battery-operated transport vehicle V2 travels along a first travel path T1, then it would also be preferable to actively use a battery-operated transport vehicle V2. For example, if a battery-operated transport vehicle V2 can charge its battery VB while traveling along a first travel path T1 by a greater amount than the amount of electricity supplied (thus lost) by the battery VB, the amount of time during which the battery-operated transport vehicle V2 is unavailable for use due to recharging may be reduced by actively using a battery-operated transport vehicle V2. In such a case, it is preferable that, in a selecting operation, the managing device K selects, based on the location information of the processing devices, a battery-operated transport vehicle V2 as the assigned transport vehicle when at least one of the processing device that is the transport origin specified in a transport command and the processing device that is the transport destination specified in the transport command is located along a second travel path T2. With such arrangement, a battery-operated transport vehicle V2 would transport the article B by itself when the transporting path from the transport origin to the transport destination includes, in its part, a path that cannot be traveled by the supplied-electricity-operated transport vehicle V1. Therefore, the transport efficiency improves since it becomes unnecessary to relay the article B between different transport vehicles V.

As described above, an article transport facility can be provided in which lowering of the transport efficiency is reduced to the extent possible when transporting an article B between a transport target location located along a first travel path T1 along which electricity is supplied to the transport vehicle V and a transport target location located along a second travel path T2 along which electricity is not supplied to the transport vehicle V.

Alternative Embodiments (1) In the description provided above, an example is illustrated in which an article transport facility is incorporated into a semiconductor processing facility. However, an article transport facility may be incorporated into any facility, other than a semiconductor processing facility, as long as the facility is provided with one or more transport vehicles that travel along one or more travel paths and are powered by electricity.

(2) In the description provided above, an example is described in which the travel paths T are divided into four power-supply sections that correspond to the first area A1 through the fourth area A4 respectively; however, the number of power-supply sections may be less than or greater than four. In addition, in the embodiment described above, an example is described in which the power-supply sections are provided to correspond to the first area A1 through the fourth area A4 respectively; however, how and where the power-supply sections are located or arranged may be changed suitably.

(3) In the description provided above, electricity supply members that supply electricity without contact are provided with which induced current is generated in the induction-coils VE by the changing magnetic fields around the electricity supply lines RH. However, contact-type electricity supplying members may instead be used which receive electricity supplied from electricity receiving elements that are adapted to contact the electricity supply lines RH.

(4) In the description provided above, an arrangement is described in which each second travel path T2 is a travel path T with power-supply sections in which the electricity supply lines RH are switched to the electricity non-supplying state; however, in lieu of such arrangement, each second travel path T2 may consist of sections to which no electricity supply lines RH are provided.

Brief Summary of Embodiments

The article transport facility described above is briefly summarized next.

In one embodiment, an article transport facility comprises: travel paths provided to interconnect a plurality of processing devices; transport vehicles for traveling along the travel paths to transport articles processed by one or more of the plurality of processing devices; a managing member for managing traveling of the transport vehicles; wherein the travel paths include one or more first travel paths in which electricity is supplied to the transport vehicles, and one or more second travel paths in which electricity is not supplied to the transport vehicles, wherein the transport vehicles include a first transport vehicle configured to travel by means of electricity supplied from the one or more first travel paths, and a second transport vehicle having a battery and configured to travel by means of electricity supplied from the battery; wherein the one or more first travel paths and the one or more second travel paths are connected to one another directly or indirectly, wherein the managing member is configured: to manage traveling of the first transport vehicle to allow the first transport vehicle to travel only along one or more of the one or more first travel paths; and to manage traveling of the second transport vehicle to allow the second transport vehicle to travel along both one or more of the one or more first travel paths and one or more of the one or more second travel paths.

With the arrangement described above, when both the transport origin (starting point of an transporting operation) and the transport destination for the article are located along a first travel path, the transporting of the article can be completed by one transport vehicle by causing either the first transport vehicle or the second transport vehicle to transport the article. In addition, when both the transport origin and the transport destination for the article are located along a second travel path, the transporting of the article can be completed by one transport vehicle by causing the second travel vehicle to transport the article. Furthermore, the second transport vehicle can travel along both a first travel path and a second travel path which are connected to each other directly or indirectly. Therefore, when the transport origin for the article is located along one of a first travel path and a second travel path, and the transport destination is located along the other of a first travel path and a second travel path, the transporting of the article from the transport origin to the transport destination can be completed by one transport vehicle by causing the second transport vehicle to transport the article. Thus, with the above arrangement, lowering of the transport efficiency can be reduced when transporting an article between a transport target location that belongs to, located along, or associated with, a first travel path in which actuating electricity is supplied to the transport vehicles and a transport target location that belongs to, located along, or associated with, a second travel path in which actuating electricity is not supplied to the transport vehicles.

In addition, the transporting of the article cannot be completed only by the first transport vehicle when one of the transport origin and the transport destination belongs to, is located along, or associated with, a power-supply section in the electricity non-supplying state, or when the transport vehicle needs to travel through a power-supply section in the non-supply state during the travel even if both of the transport origin and the transport destination belong to, are located along, or associated with, power-supply sections in the electricity supplying state. However, even in those situations, by using the second transport vehicle, the article can be transported by a single second transport vehicle without having to have the article relayed between different transport vehicles even if a power-supply section in the electricity non-supplying state exists between the transport origin and the transport destination. In other words, lowering of the transport efficiency can be reduced even if a power-supply section in the electricity non-supplying state exists between the transport origin and the transport destination. As such, the arrangement above can reduce lowering of the operation efficiency and the transport efficiency of the facility.

Here, in the article transport facility, it is preferable that the managing member: stores location information of one or more processing devices that are associated with respective ones of the one or more first paths and location information of one or more processing devices that are associated with respective ones of the one or more second travel paths; and performs: a command generating operation in which a transport command is generated for transporting an article from a processing device of transport origin for the article to a processing device of transport destination for the article, a selecting operation in which one or more assigned transport vehicles which are assigned to perform transporting of the article specified in the transport command are selected from the transport vehicles, and a command output operation for outputting the transport command to the one or more assigned transport vehicles selected in the selecting operation, wherein, in the selecting operation, the managing member selects the second transport vehicle as the one or more assigned transport vehicles, based on the location information of one or more processing devices, if at least one of the processing device of transport origin specified in the transport command and the processing device of transport destination specified in the transport command is located along one of the one or more second travel paths.

The transport of the article cannot be completed only by the first transport vehicle if one of the processing device of transport origin and the processing device of transport destination is located along a second travel path. In order to transport the article using the first transport vehicle, it is necessary to relay the article on the way and to also use the second transport vehicle. However, the article can be transported from the transport origin to the transport destination without having to relay the article if the second transport vehicle is selected as the assigned transport vehicle. As a result, lowering of the transport efficiency of the article transport device can be reduced. Note that when consumption of electricity from the battery mounted on the second transport vehicle is taken into consideration, it would be preferable to arrange the article transport facility as follows. It is preferable if the managing member selects the first transport vehicle as the assigned transport vehicle when both a processing device designated as the transport origin in a transport command and a processing device designated as the transport destinations in the transport command are located along a first travel path. By so selecting the assigned transport vehicle, the second transport vehicle can be operated more appropriately and effectively, thereby reducing the amount of time required to recharge the battery on the second transport vehicle and reducing lowering of the transport efficiency.

In addition, in the article transport facility, the managing member preferably: stores location information of one or more processing devices that are associated with respective ones of the one or more first paths and location information of one or more processing devices that are associated with respective ones of the one or more second travel paths; and performs: a command generating operation in which a transport command is generated for transporting an article from a processing device of transport origin for the article to a processing device of transport destination for the article, a selecting operation in which one or more assigned transport vehicles which are assigned to perform transporting of the article specified in the transport command are selected from the transport vehicles, and a command output operation for outputting the transport command to the one or more assigned transport vehicles selected in the selecting operation, wherein, in the selecting operation, the managing member preferably: selects, as the one or more assigned transport vehicles, based on the location information of one or more processing devices, only the first transport vehicle, or only the second transport vehicle, or both the first transport vehicle and the second transport vehicle, when the processing device of transport origin specified in the transport command is located along one of the one or more first travel paths; and selects, as the one or more assigned transport vehicles, based on the location information of one or more processing devices, only the second transport vehicle, or both the first transport vehicle and the second transport vehicle, when the processing device of transport origin specified in the transport command is located along one of the one or more second travel paths.

That is, when the processing device that is the transport origin specified in the transport command is located along a first travel path, the article to be transported can be either the first transport vehicle for the second transport vehicle. And when the processing device of the transport destination is located along a first travel path, the first transport vehicle can be selected as the assigned transport vehicle since the transporting of the article can be completed by only the first transport vehicle. On the other hand, since transporting by the second transport vehicle is also required when the processing device of the transport destination is located along a second travel path, the first transport vehicle and the second transport vehicle are selected as the assigned transport vehicles. Since the second transport vehicle can travel along both a first travel path and a second travel path, the second transport vehicle can be selected as the assigned transport vehicle regardless of the location of the processing device of transport destination. When transporting an article, the facility is often controlled such that a transport vehicle located near the processing device of transport origin is caused to travel to receive the article to reduce the travel time to improve the transport efficiency. As such, when the processing device of transport origin is located along a first travel path, the transporting operation can be performed with such flexibility, which leads to reduction in the lowering of transport efficiency.

When the processing device of transport origin is located along a second travel path, the first transport vehicle cannot receive the article from the processing device of transport origin since it cannot travel along the second travel path. Thus, when the processing device of transport origin is located along a second travel path, the article can be received from the processing device that is the transport origin by selecting the second transport vehicle as the assigned transport vehicle. The second transport vehicle can travel along both a first travel path and a second travel path; thus, even when the processing device of transport destination is located along a first travel path, the article can be transported to the transport destination by causing the second transport vehicle to travel along the first travel path. Therefore, it becomes possible to reduce lowering of the article transporting efficiency when the processing device of transport destination is located along a first travel path, the article may of course be relayed to the first transport vehicle on the way. Therefore, both the second transport vehicle and the first transport vehicle may be selected as the assigned transport vehicle. It may be preferable to have the article relayed to the first transport vehicle, for example, when the battery on the second travel vehicle is low and the rate of consumption of electricity needs to be reduced.

Here, in the selecting operation, the managing member may select, as the one or more assigned transport vehicles, based on the location information of one or more processing devices, the second transport vehicle, when the processing device of transport origin specified in the transport command is located along one of the one or more second travel paths.

As described above, the second transport vehicle can travel along both a first travel path and a second travel path; thus, even when the processing device of transport destination is located along a first travel path, the article can be transported to the transport destination by causing the second transport vehicle to travel along the first travel path. In other words, since relaying of the article to the first transport vehicle is not required, lowering of article transporting efficiency due to the relaying can be reduced by selecting only the second transport vehicle as the assigned transport vehicle when the processing device of transport origin is located along a second travel path.

In addition, an article transport facility preferably further comprises: an article holder, to or from which each of the first transport vehicle and the second transport vehicle can transfer an article, is provided along one of the one or more first travel paths, wherein the first transport vehicle preferably has a first controller for controlling the first transport vehicle, wherein the second transport vehicle preferably has a second controller for controlling the second transport vehicle, the managing member preferably stores first permitted section definition data which specifies first travel-permitted sections which are sections of the travel paths in which the first transport vehicle is permitted to travel, and second permitted section definition data which specifies second travel-permitted sections which are sections of the travel paths in which the second transport vehicle is permitted to travel, wherein the first travel-permitted sections preferably include only one or more of the one or more first travel paths, wherein the second travel-permitted sections preferably include both one or more of the one or more first travel paths and one or more of the one or more second travel paths, wherein the first controller preferably causes the first transport vehicle to travel within the first travel-permitted sections based on the first permitted section definition data obtained from the managing member, wherein the second controller preferably causes the second transport vehicle to travel within the second travel-permitted sections based on the second permitted section definition data obtained from the managing member, and wherein, when transporting an article with a processing device located along one of the one or more first travel paths designated as the transport origin and a processing device located along one of the one or more second travel paths designated as the transport destination, the managing device is preferably configured: to output to the first controller a first half transport command for operating the transport vehicle to transport the article from the processing device of transport origin to the article holder and to have the article transferred to the article holder; and to output to the second controller a second half transport command for operating the second transport vehicle to have the article transferred from the article holder to the second transport vehicle and to transport the article to the processing device of the transport destination.

Since the first transport vehicle cannot travel along a second travel path, it is necessary to use the second transport vehicle when transporting an article with a processing device located along a first travel path designated as the transport origin and a processing device located along a second travel path designated as the transport destination. Because the first transport vehicle can travel to the transport origin along the first travel path, the first transport vehicle can travel to the transport origin and receive the article. And since the first transport vehicle can travel to the article holder, it can transfer the article to the article holder. Since the second transport vehicle can also travel to the article holder, it can receive the article held on the article holder and then can travel along the second travel path to transport the article to the transport destination. As such, it is made possible to perform a transporting of an article in which a processing device located along a first travel path is designated as the transport origin and a processing device located along a second travel path is designated as the transport destination, while reducing the consumption of electricity of the battery on the second transport vehicle, by not selecting the second transport vehicle for traveling along a first travel path along which it is not necessary to use the second transport vehicle to travel.

More specifically, in one embodiment of the article transport facility, the managing member preferably: generates, in the command generating operation, the first half transport command and the second half transport command, as the transport command; in the selecting operation, selects the first transport vehicle as the one or more assigned transport vehicles assigned to perform transporting of the article specified in the first half transport command, and selects the second transport vehicle as the one or more assigned transport vehicles assigned to perform transporting of the article specified in the second half transport command; and in the command output operation, outputs the first half transport command to the first transport vehicle which has the first controller, and outputs the second half transport command to the second transport vehicle which has the second controller.

In addition, the article transport facility preferably further comprises: one or more electricity supplying members for supplying electricity to the transport vehicles traveling along the travel paths, wherein the one or more electricity supplying member are preferably installed over an entire length of the one or more first travel paths and over an entire length of the one or more second travel paths, and along the longitudinal direction in which a corresponding travel path extends, wherein the one or more electricity supplying members are preferably longitudinally divided into a plurality of power-supply sections, wherein each of the plurality of power-supply sections can preferably be individually switched between a supplying state for supplying electricity and a non-supplying state for not supplying electricity, wherein one or more of the one or more electricity supplying members for the one or more first travel paths preferably consist of one or more power-supply sections in the supplying state, and wherein one or more of the one or more electricity supplying members for the one or more second travel paths preferably consist of one or more power-supply sections in the non-supplying state.

Since the one or more electricity supplying members are provided along the travel paths, when performing work such as work on the travel rails which define the travel paths (for replacing the rails or installing new rails, which will be generally be referred to as work on the travel paths), the electricity supplying members in the power-supply section that correspond to the location of the work and its surrounding area need to be placed in the electricity non-supplying state. With the arrangement described above, each of the plurality of power-supply sections provided along the travel paths, the electricity supplying members can be individually switched between the supplying state and the non-supplying state. Therefore, when performing such work, the electricity supplying members can be switched to the non-supplying state only for the power-supply section in which the work is performed. Thus, when performing such work on a travel path, it is not necessary to stop the operation of the entire facility by stopping the supply of power to the power-supply sections in which work is not performed. Therefore, lowering of operating efficiency of the facility can be reduced.

What is claimed is:

1. An article transport facility comprising:
    travel paths provided to interconnect a plurality of processing devices;
    transport vehicles for traveling along the travel paths to transport articles processed by one or more of the plurality of processing devices;
    a managing member for managing traveling of the transport vehicles;
    wherein the travel paths include one or more first travel paths in which electricity is supplied to the transport vehicles, and one or more second travel paths in which electricity is not supplied to the transport vehicles,
    wherein the transport vehicles include a first transport vehicle configured to travel by means of electricity supplied from the one or more first travel paths, and a second transport vehicle having a battery and configured to travel by means of electricity supplied from the battery;
    wherein the one or more first travel paths and the one or more second travel paths are connected to one another directly or indirectly,
    wherein the managing member is configured:
    to manage traveling of the first transport vehicle to allow the first transport vehicle to travel only along one or more of the one or more first travel paths; and
    to manage traveling of the second transport vehicle to allow the second transport vehicle to travel along both one or more of the one or more first travel paths and one or more of the one or more second travel paths.

2. The article transport facility as defined in claim 1, wherein
    the managing member:
    stores location information of one or more processing devices that are associated with respective ones of the one or more first paths and location information of one or more processing devices that are associated with respective ones of the one or more second travel paths; and performs:
    a command generating operation in which a transport command is generated for transporting an article from a processing device of transport origin for the article to a processing device of transport destination for the article, a selecting operation in which one or more assigned transport vehicles which are assigned to perform transporting of the article specified in the transport command are selected from the transport vehicles, and a command output operation for outputting the transport command to the one or more assigned transport vehicles selected in the selecting operation, wherein, in the selecting operation, the managing member selects the second transport vehicle as the one or more assigned transport vehicles, based on the location information of one or more processing devices, if at least one of the processing device of transport origin specified in the transport command and the processing device of transport destination specified in the transport command is located along one of the one or more second travel paths.

3. The article transport facility as defined in claim 1, wherein the managing member:

stores location information of one or more processing devices that are associated with respective ones of the one or more first paths and location information of one or more processing devices that are associated with respective ones of the one or more second travel paths; and performs:

a command generating operation in which a transport command is generated for transporting an article from a processing device of transport origin for the article to a processing device of transport destination for the article, a selecting operation in which one or more assigned transport vehicles which are assigned to perform transporting of the article specified in the transport command are selected from the transport vehicles, and a command output operation for outputting the transport command to the one or more assigned transport vehicles selected in the selecting operation, wherein, in the selecting operation, the managing member:

selects, as the one or more assigned transport vehicles, based on the location information of one or more processing devices, only the first transport vehicle, or only the second transport vehicle, or both the first transport vehicle and the second transport vehicle, when the processing device of transport origin specified in the transport command is located along one of the one or more first travel paths; and selects, as the one or more assigned transport vehicles, based on the location information of one or more processing devices, only the second transport vehicle, or both the first transport vehicle and the second transport vehicle, when the processing device of transport origin specified in the transport command is located along one of the one or more second travel paths.

4. The article transport facility as defined in claim 3, wherein in the selecting operation, the managing member selects, as the one or more assigned transport vehicles, based on the location information of one or more processing devices, the second transport vehicle, when the processing device of transport origin specified in the transport command is located along one of the one or more second travel paths.

5. The article transport facility as defined in claim 3, further comprising:

an article holder, to or from which each of the first transport vehicle and the second transport vehicle can transfer an article, is provided along one of the one or more first travel paths, wherein the first transport vehicle has a first controller for controlling the first transport vehicle, wherein the second transport vehicle has a second controller for controlling the second transport vehicle, wherein the managing member stores first permitted section definition data which specifies first travel-permitted sections which are sections of the travel paths in which the first transport vehicle is permitted to travel, and second permitted section definition data which specifies second travel-permitted sections which are sections of the travel paths in which the second transport vehicle is permitted to travel, wherein the first travel-permitted sections include only one or more of the one or more first travel paths, wherein the second travel-permitted sections include both one or more of the one or more first travel paths and one or more of the one or more second travel paths, wherein the first controller causes the first transport vehicle to travel within the first travel-permitted sections based on the first permitted section definition data obtained from the managing member, wherein the second controller causes the second transport vehicle to travel within the second travel-permitted sections based on the second permitted section definition data obtained from the managing member, and wherein, when transporting an article with a processing device located along one of the one or more first travel paths designated as the transport origin and a processing device located along one of the one or more second travel paths designated as the transport destination, the managing device is configured:

to output to the first controller a first half transport command for operating the transport vehicle to transport the article from the processing device of transport origin to the article holder and to have the article transferred to the article holder; and to output to the second controller a second half transport command for operating the second transport vehicle to have the article transferred from the article holder to the second transport vehicle and to transport the article to the processing device of the transport destination.

6. The article transport facility as defined in claim 5, wherein the managing member:

generates, in the command generating operation, the first half transport command and the second half transport command, as the transport command;

in the selecting operation, selects the first transport vehicle as the one or more assigned transport vehicles assigned to perform transporting of the article specified in the first half transport command, and selects the second transport vehicle as the one or more assigned transport vehicles assigned to perform transporting of the article specified in the second half transport command;

in the command output operation, outputs the first half transport command to the first transport vehicle which has the first controller, and outputs the second half transport command to the second transport vehicle which has the second controller.

7. The article transport facility as defined in claim 4, wherein
an article holder, to or from which each of the first transport vehicle and the second transport vehicle can transfer an article, is provided along one of the one or more first travel paths,
wherein the first transport vehicle has a first controller for controlling the first transport vehicle,
wherein the second transport vehicle has a second controller for controlling the second transport vehicle,
the managing member stores first permitted section definition data which specifies first travel-permitted sections which are sections of the travel paths in which the first transport vehicle is permitted to travel, and second permitted section definition data which specifies second travel-permitted sections which are sections of the travel paths in which the second transport vehicle is permitted to travel,
wherein the first travel-permitted sections include only one or more of the one or more first travel paths,
wherein the second travel-permitted sections include both one or more of the one or more first travel paths and one or more of the one or more second travel paths,
wherein the first controller causes the first transport vehicle to travel within the first travel-permitted sections based on the first permitted section definition data obtained from the managing member,
wherein the second controller causes the second transport vehicle to travel within the second travel-permitted sections based on the second permitted section definition data obtained from the managing member, and
wherein, when transporting an article with a processing device located along one of the one or more first travel paths designated as the transport origin and a processing device located along one of the one or more second travel paths designated as the transport destination, the managing device is configured:
to output to the first controller a first half transport command for operating the transport vehicle to transport the article from the processing device of transport origin to the article holder and to have the article transferred to the article holder; and
to output to the second controller a second half transport command for operating the second transport vehicle to have the article transferred from the article holder to the second transport vehicle and to transport the article to the processing device of the transport destination.

8. The article transport facility as defined in claim 7, wherein
the managing member:
generates, in the command generating operation, the first half transport command and the second half transport command, as the transport command;
in the selecting operation, selects the first transport vehicle as the one or more assigned transport vehicles assigned to perform transporting of the article specified in the first half transport command, and selects the second transport vehicle as the one or more assigned transport vehicles assigned to perform transporting of the article specified in the second half transport command;
in the command output operation, outputs the first half transport command to the first transport vehicle which has the first controller, and outputs the second half transport command to the second transport vehicle which has the second controller.

9. The article transport facility as defined in claim 1, further comprising:
one or more electricity supplying members for supplying electricity to the transport vehicles traveling along the travel paths,
wherein the one or more electricity supplying member are installed over an entire length of the one or more first travel paths and over an entire length of the one or more second travel paths, and along the longitudinal direction in which a corresponding travel path extends,
wherein the one or more electricity supplying members are longitudinally divided into a plurality of power-supply sections,
wherein each of the plurality of power-supply sections can be individually switched between a supplying state for supplying electricity and a non-supplying state for not supplying electricity,
wherein one or more of the one or more electricity supplying members for the one or more first travel paths consist of one or more power-supply sections in the supplying state, and
wherein one or more of the one or more electricity supplying members for the one or more second travel paths consist of one or more power-supply sections in the non-supplying state.

10. The article transport facility as defined in claim 5, further comprising:
one or more electricity supplying members for supplying electricity to the transport vehicles traveling along the travel paths,
wherein the one or more electricity supplying member are installed over an entire length of the one or more first travel paths and over an entire length of the one or more second travel paths, and along the longitudinal direction in which a corresponding travel path extends,
wherein the one or more electricity supplying members are longitudinally divided into a plurality of power-supply sections,
wherein each of the plurality of power-supply sections can be individually switched between a supplying state for supplying electricity and a non-supplying state for not supplying electricity,
wherein one or more of the one or more electricity supplying members for the one or more first travel paths consist of one or more power-supply sections in the supplying state, and
wherein one or more of the one or more electricity supplying members for the one or more second travel paths consist of one or more power-supply sections in the non-supplying state.

11. The article transport facility as defined in claim 7, further comprising:
one or more electricity supplying members for supplying electricity to the transport vehicles traveling along the travel paths,
wherein the one or more electricity supplying member are installed over an entire length of the one or more first travel paths and over an entire length of the one or more second travel paths, and along the longitudinal direction in which a corresponding travel path extends,
wherein the one or more electricity supplying members are longitudinally divided into a plurality of power-supply sections,
wherein each of the plurality of power-supply sections can be individually switched between a supplying state for supplying electricity and a non-supplying state for not supplying electricity, wherein one or more of the one or more electricity supplying members for the one or more first travel paths consist of one or more power-supply sections in the supplying state, and wherein one or more of the one or more electricity supplying members for the one or more second travel paths consist of one or more power-supply sections in the non-supplying state.

* * * * *